United States Patent
Chen et al.

(10) Patent No.: US 8,900,996 B2
(45) Date of Patent: Dec. 2, 2014

(54) THROUGH SILICON VIA STRUCTURE AND METHOD OF FABRICATING THE SAME

(75) Inventors: Hsin-Yu Chen, Nantou County (TW); Home-Been Cheng, Keelung (TW); Yu-Han Tsai, Kaohsiung (TW); Ching-Li Yang, Ping-Tung Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 60 days.

(21) Appl. No.: 13/528,867

(22) Filed: Jun. 21, 2012

(65) Prior Publication Data
US 2013/0341799 A1 Dec. 26, 2013

(51) Int. Cl.
*H01L 23/485* (2006.01)

(52) U.S. Cl.
USPC ........... 438/668; 438/629; 438/666; 438/667; 438/672; 438/675; 438/637; 438/618; 438/98; 438/523; 438/620; 257/182; 257/612; 257/698; 257/699; 257/774

(58) Field of Classification Search
USPC .................. 257/773–775, 776, 752, E23.011, 257/E26.067, E23.174, E21.576–E21.586, 257/182, 621–623, 698–699, E23.067, 257/E21.649, E21.42, E21.507; 438/459, 438/455, 460, 977, 612, 589, 629–641, 438/666–675, 98, 523–524, 533, 618–620
See application file for complete search history.

(56) References Cited

U.S. PATENT DOCUMENTS

| | | |
|---|---|---|
| 3,150,299 A | 9/1964 | Noyce |
| 3,256,465 A | 6/1966 | Weissenstem |
| 3,323,198 A | 6/1967 | Shortes |
| 3,343,256 A | 9/1967 | Smith |
| 3,372,070 A | 3/1968 | Zuk |
| 3,462,650 A | 8/1969 | Hennings |
| 3,648,131 A | 3/1972 | Stuby |
| 4,394,712 A | 7/1983 | Anthony |
| 4,395,302 A | 7/1983 | Courduvelis |
| 4,616,247 A | 10/1986 | Chang |
| 4,773,972 A | 9/1988 | Mikkor |
| 4,939,568 A | 7/1990 | Kato |
| 5,214,000 A | 5/1993 | Chazan |
| 5,229,647 A | 7/1993 | Gnadinger |
| 5,286,926 A | 2/1994 | Kimura |
| 5,372,969 A | 12/1994 | Moslehi |
| 5,399,898 A | 3/1995 | Rostoker |
| 5,463,246 A | 10/1995 | Matsunami |
| 5,484,073 A | 1/1996 | Erickson |
| 5,502,333 A | 3/1996 | Bertin |

(Continued)

*Primary Examiner* — David Vu
*Assistant Examiner* — Cuong B Nguyen
(74) *Attorney, Agent, or Firm* — Winston Hsu; Scott Margo

(57) ABSTRACT

A method of fabricating a through silicon via (TSV) structure is provided, in which, a first dielectric layer is formed on the substrate, the first dielectric layer is patterned to have at least one first opening, a via hole is formed in the first dielectric layer and the substrate, a second dielectric layer is conformally formed on the first dielectric layer, the second dielectric layer has at least one second opening corresponding to the at least one first opening, and the second dielectric layer covers a sidewall of the via hole. A conductive material layer is formed to fill the via hole and the second opening. The conductive material layer is planarized to form a TSV within the via hole. A TSV structure is also provided, in which, the second dielectric layer is disposed within the first opening and on the sidewall of the via hole.

10 Claims, 6 Drawing Sheets

(56) References Cited

U.S. PATENT DOCUMENTS

| | | |
|---|---|---|
| 5,627,106 A | 5/1997 | Hsu |
| 5,793,115 A | 8/1998 | Zavracky |
| 5,977,640 A | 11/1999 | Bertin |
| 6,018,196 A | 1/2000 | Noddin |
| 6,143,616 A | 11/2000 | Geusic |
| 6,274,937 B1 | 8/2001 | Ahn |
| 6,309,956 B1 | 10/2001 | Chiang |
| 6,391,777 B1 | 5/2002 | Chen |
| 6,407,002 B1 | 6/2002 | Lin |
| 6,440,640 B1 | 8/2002 | Yang |
| 6,483,147 B1 | 11/2002 | Lin |
| 6,525,419 B1 | 2/2003 | Deeter |
| 6,548,891 B2 | 4/2003 | Mashino |
| 6,551,857 B2 | 4/2003 | Leedy |
| 6,627,985 B2 | 9/2003 | Huppenthal |
| 6,633,083 B2 | 10/2003 | Woo |
| 6,746,936 B1 | 6/2004 | Lee |
| 6,778,275 B2 | 8/2004 | Bowes |
| 6,800,930 B2 | 10/2004 | Jackson |
| 6,812,193 B2 | 11/2004 | Brigham |
| 6,831,013 B2 | 12/2004 | Tsai |
| 6,897,148 B2 | 5/2005 | Halahan |
| 6,924,551 B2 | 8/2005 | Rumer |
| 6,930,048 B1 | 8/2005 | Li |
| 7,034,401 B2 | 4/2006 | Savastiouk |
| 7,052,937 B2 | 5/2006 | Clevenger |
| 7,075,133 B1 | 7/2006 | Padmanabhan |
| 7,098,070 B2 | 8/2006 | Chen |
| 7,111,149 B2 | 9/2006 | Eilert |
| 7,166,913 B2 | 1/2007 | Chinthakindi |
| 7,222,420 B2 | 5/2007 | Moriizumi |
| 7,282,951 B2 | 10/2007 | Huppenthal |
| 7,323,785 B2 | 1/2008 | Uchiyama |
| 7,338,896 B2 | 3/2008 | Vanhaelemeersch |
| 7,402,515 B2 | 7/2008 | Arana |
| 7,432,592 B2 | 10/2008 | Shi |
| 7,531,415 B2 | 5/2009 | Kwok |
| 7,541,677 B2 | 6/2009 | Kawano |
| 7,732,926 B2 | 6/2010 | Uchiyama |
| 7,846,837 B2 | 12/2010 | Kuo |
| 2001/0038972 A1 | 11/2001 | Lyons |
| 2004/0080041 A1 | 4/2004 | Kimura |
| 2004/0188817 A1 | 9/2004 | Hua |
| 2005/0112997 A1 | 5/2005 | Lin |
| 2005/0136635 A1 | 6/2005 | Savastiouk |
| 2005/0205991 A1 | 9/2005 | Chen |
| 2006/0035146 A1 | 2/2006 | Hayashi |
| 2006/0042834 A1 | 3/2006 | Lee |
| 2007/0117348 A1 | 5/2007 | Ramanathan |
| 2007/0126085 A1 | 6/2007 | Kawano |
| 2007/0178694 A1* | 8/2007 | Hiatt .............................. 438/667 |
| 2007/0190692 A1* | 8/2007 | Erturk et al. ................... 438/118 |
| 2008/0073747 A1 | 3/2008 | Chao |
| 2008/0108193 A1 | 5/2008 | You |
| 2009/0127667 A1 | 5/2009 | Iwata |
| 2009/0134498 A1 | 5/2009 | Ikeda |
| 2009/0180257 A1 | 7/2009 | Park |
| 2009/0212438 A1* | 8/2009 | Kreupl et al. .................. 257/773 |
| 2009/0224405 A1 | 9/2009 | Chiou |
| 2010/0001379 A1 | 1/2010 | Lee |
| 2010/0084747 A1* | 4/2010 | Chen et al. ..................... 257/621 |
| 2010/0140749 A1 | 6/2010 | Kuo |
| 2010/0140772 A1 | 6/2010 | Lin |
| 2010/0244247 A1 | 9/2010 | Chang |
| 2010/0257495 A1 | 10/2010 | Wu |
| 2010/0323478 A1 | 12/2010 | Kuo |
| 2011/0241205 A1* | 10/2011 | Kirby et al. .................... 257/738 |
| 2012/0091593 A1* | 4/2012 | Cheng et al. ................... 257/774 |

* cited by examiner

THROUGH SILICON VIA STRUCTURE AND METHOD OF FABRICATING THE SAME

BACKGROUND OF THE INVENTION

1. Field of the Invention

The present invention relates to a fabrication method and a structure of a through silicon via (TSV).

2. Description of the Prior Art

In the field of semiconductor technology, a TSV structure is utilized for interconnect between die and die to provide electrical connection of the devices on each level, such that the linking distances of devices disposed on a chip can be remarkably reduced, and, in turn, the overall operation speed can be effectively increased. In another technology such as semiconductor packaging, there are many ways such as wire bonding or flip chip combining wire bonding technologies to stack IC chips vertically. In recent years, silicon interposer with TSV (through silicon via) interconnect technology has gained increasing attention. It provides relatively high routing density and very fine pitch with good electrical performance.

Ordinarily, the TSV structure is obtained by forming a via hole on the front side of a wafer by etching or laser process and filling the via hole with a conductive material, such as polysilicon, copper or tungsten, to form a conductive path (i.e. the interconnect structure). Finally, the back side of the wafer, or die, is thinned to expose the conductive path.

However, the via hole is formed on the front side of the wafer, and after the conductive material is filled into the via hole, a surplus of the conductive material located on the interlayer dielectric is often removed by performing a chemical-mechanical polishing (CMP) process. In such process, a loading effect takes place during the grinding procedure that an abrasion rate in a region having a dense pattern and an abrasion rate in a region having a sparse (non-dense) pattern are different. Suffering from the loading effect, two regions which are supposed to be electrically separated from each other by removing conductive material using the CMP process tend to be not successfully separated due to a metal bridge structure formed on top surface of the TSV after the planarization; and accordingly the yield or quality of the products are affected.

Therefore, there is still a need for a novel fabrication method of TSV structures to avoid the aforesaid problems.

SUMMARY OF THE INVENTION

One objective of the present invention is to provide a method of fabricating a through silicon via structure and a through silicon via structure, which may avoid the aforesaid problems.

According to one embodiment of the present invention, a method of fabricating a through silicon via structure is provided. The method includes steps as follows. First, a substrate is provided. A first dielectric layer is formed on the substrate. The first dielectric layer is patterned to have at least one first opening. A via hole is formed in the first dielectric layer and the substrate. Thereafter, a second dielectric layer is formed on the first dielectric layer in compliance with a shape of the first dielectric layer. The second dielectric layer has at least one second opening corresponding to the at least one first opening. The second dielectric layer covers a sidewall of the via hole. Thereafter, a conductive material layer is formed to fill the via hole and the at least one second opening. The conductive material layer is planarized to form a through silicon via within the via hole.

According to another embodiment of the present invention, a through silicon via structure is provided and includes a substrate, a first dielectric layer, a via hole, a second dielectric layer, and a conductive layer. The first dielectric layer is disposed on the substrate and has at least one first opening. The via hole is disposed through the first dielectric layer and the substrate. The second dielectric layer is disposed within the at least one first opening and on a sidewall of the via hole. A conductive layer is disposed within the via hole having the second dielectric layer on the sidewall of the via hole; and thereby a through silicon via is formed.

According to the embodiments of the present invention, the interlayer dielectric-level zero (ILD-0) is utilized to form one or more openings near a via hole, and the opening/openings and the via hole are filled with a same conductive material. Accordingly, during a planarization process such as CMP process, the metal distribution on the planarized surface can be more uniform than that in the conventional technology, so that a significant loading effect will not occur and the bridge issue can be avoided or alleviated.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
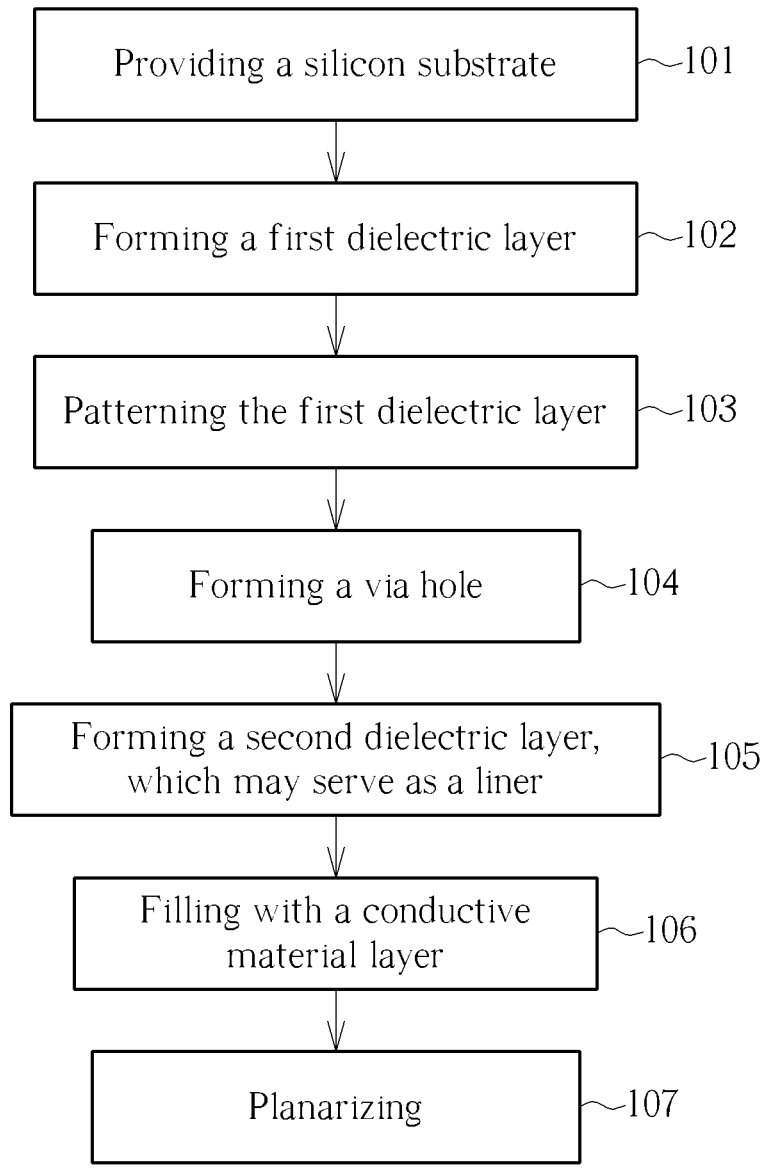
FIG. 1 is a flow chart illustrating a method of fabricating a TSV structure according to one embodiment of the present invention.

Embodiments of the present invention will be described in detail referring to FIGS. 1-8. FIG. 1 is a flow chart illustrating a method of fabricating a TSV structure according to an embodiment of the present invention. FIGS. 2, 3, 5 to 7A are schematic cross-sectional views illustrating an embodiment of the present invention. FIGS. 7B and 7C illustrate some variations. FIG. 4 illustrates another embodiment. FIG. 8 is a schematic plan view illustrating one embodiment of the present invention. It should be noted that the drawing size of the figures is not in a real scale ratio and just schematic for reference. The same elements of the embodiments may be marked with the same referral numbers.

Figure 2:
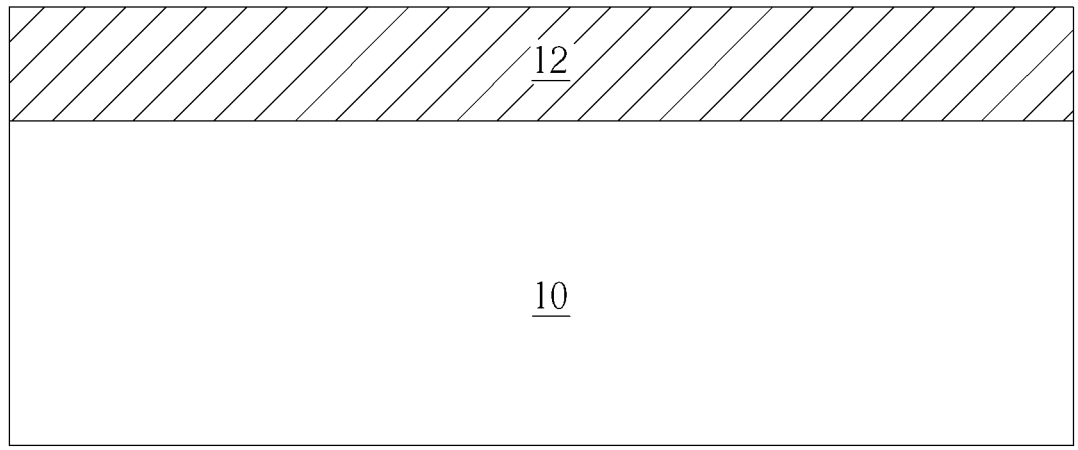
FIGS. 2 to 6, 7A, 7B, and 7C are schematic cross-sectional views illustrating a method of fabricating a TSV structure according to some embodiments of the present invention.

Referring to FIGS. 1 and 2, Step 101 is performed to provide a substrate 10. The substrate 10 may comprise monocrystalline silicon. Step 102 is performed to form a first dielectric layer such as a dielectric layer 12 on the substrate 10. The dielectric layer 12 may be also referred to as an interlayer dielectric-level zero (ILD-0) or a zero-layer. Generally, a dielectric layer between active elements on a substrate and a first metal layer of a metal interconnect structure is referred to as an interlayer dielectric-level first (ILD-1), and the interlayer dielectric-level zero is a dielectric layer disposed between the substrate and the interlayer dielectric-level first. The dielectric layer 12 may be, for example, an oxide layer and formed through a chemical vapor deposition (CVD) process, but not limited thereto.

Figure 3:
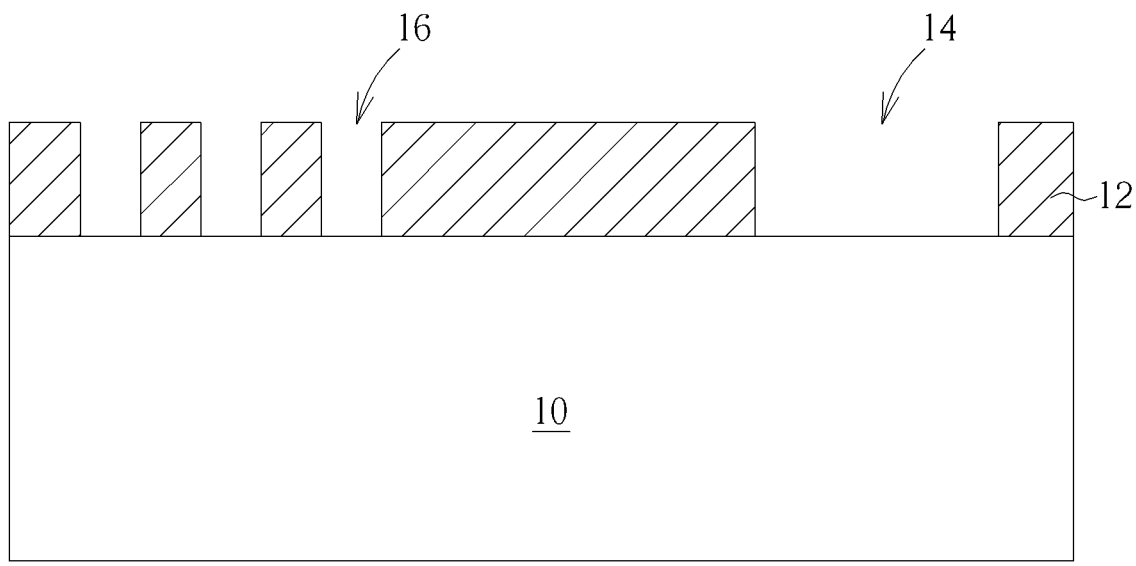
Figure 4:
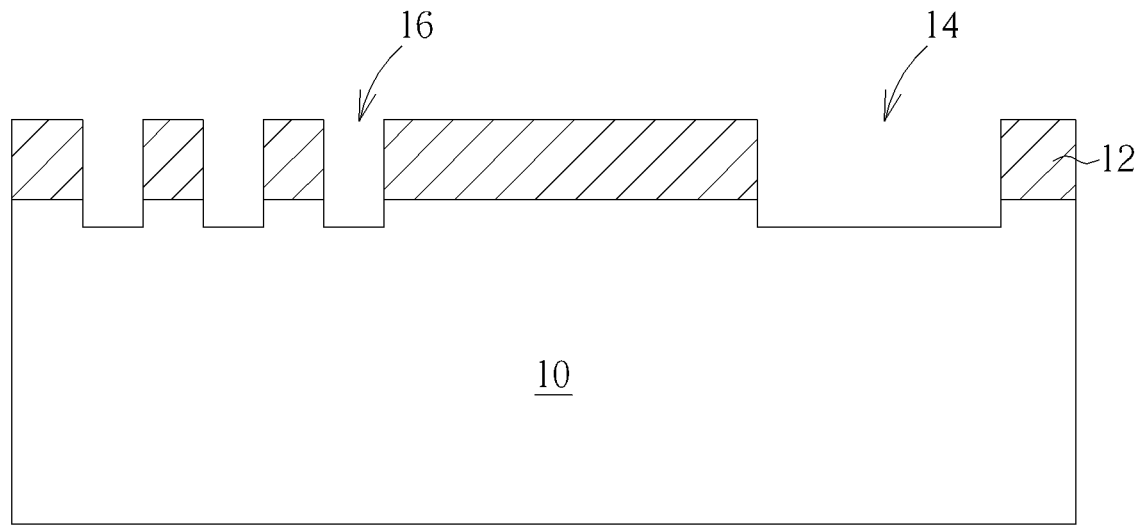

Thereafter, referring to FIGS. 1 and 3, Step 103 is performed to pattern the dielectric layer 12 to have at least one first opening, such as an opening 14 and a plurality of openings 16, which are each located near or in a neighborhood of a predetermined location of a TSV. The openings are intended for formation of dummy TSVs thereinside in later processes to allow a more uniform metal distribution density of the surface of the conductive material layer (such as a metal layer) of a TSV to be polished during planarization (such as a CMP process) so as to avoid or alleviate the loading issue due to uneven loading. Accordingly, the location, size, shape and number of the opening are not particularly limited, as long as the opening/openings are disposed near or in the neighborhood of the TSV to allow the polishing surface to have a relative uniform metal distribution (metal density) during a CMP process. The dielectric layer 12 may be patterned using photolithography and etching processes, in which, the etching of the dielectric layer 12 may stop on the substrate 10 as shown in FIG. 3, and accordingly, the bottoms of the openings 14 and 16 are portions of the original surface of the substrate, but it is not limited thereto. The original surface is the surface of the substrate 10 contacting the dielectric layer 12 originally. In other embodiments, the etching may stop in the dielectric layer 12, and the bottoms of the openings 14 and 16 are located higher than the original surface of the substrate 10; or, as shown in FIG. 4, the etching may stop in the substrate 10, and the bottoms of the openings 14 and 16 are located lower than the original surface of the substrate 10.

Figure 5:
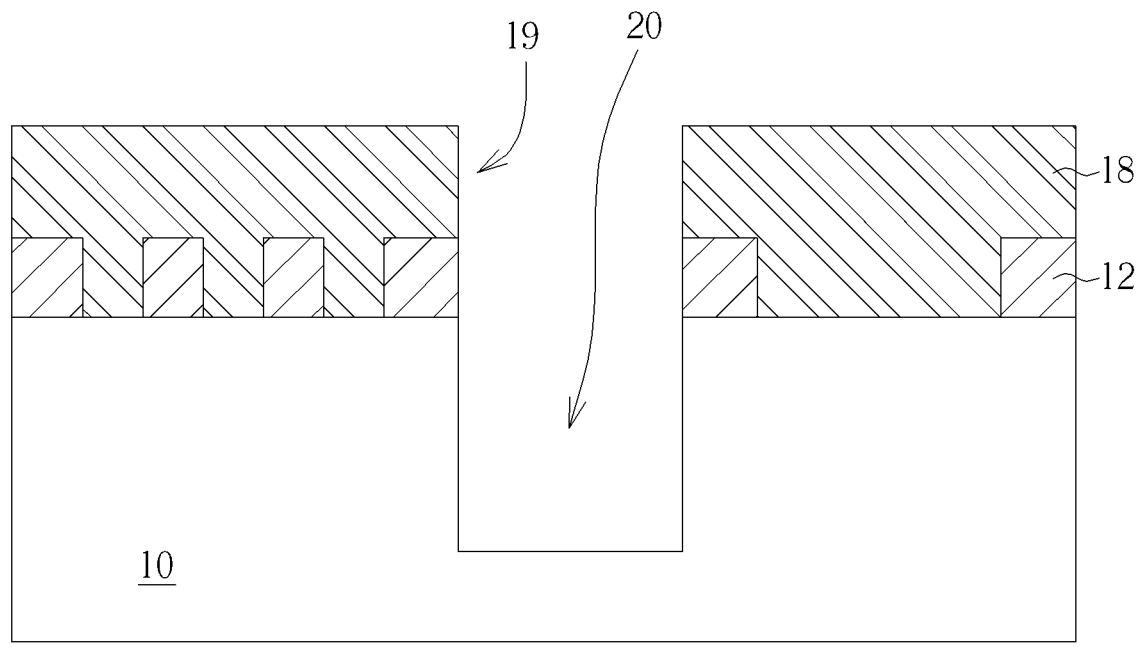

Thereafter, referring to FIGS. 1 and 5, Step 104 is performed to form a via hole 20 in the dielectric layer 12 and the substrate 10. Steps of forming the via hole 20 may include, for example, forming a photo resist layer 18 on the dielectric layer 12 and within the openings; patterning the photo resist layer 18, using for example a photolithography process, to have an opening 19 exposing the underlying dielectric layer 12 and the substrate 10; and partially removing the dielectric layer 12 and the substrate 10 through this opening using the patterned photo resist layer 18 as a mask to form the via hole 20. The hole diameter of the via hole 20 and the hole diameter of the opening 14 may be allowed to be, for example, about the same or similar. The hole diameter of the opening 16 may be allowed to be, for example, less than the hole diameter of the via hole 20.

Figure 6:
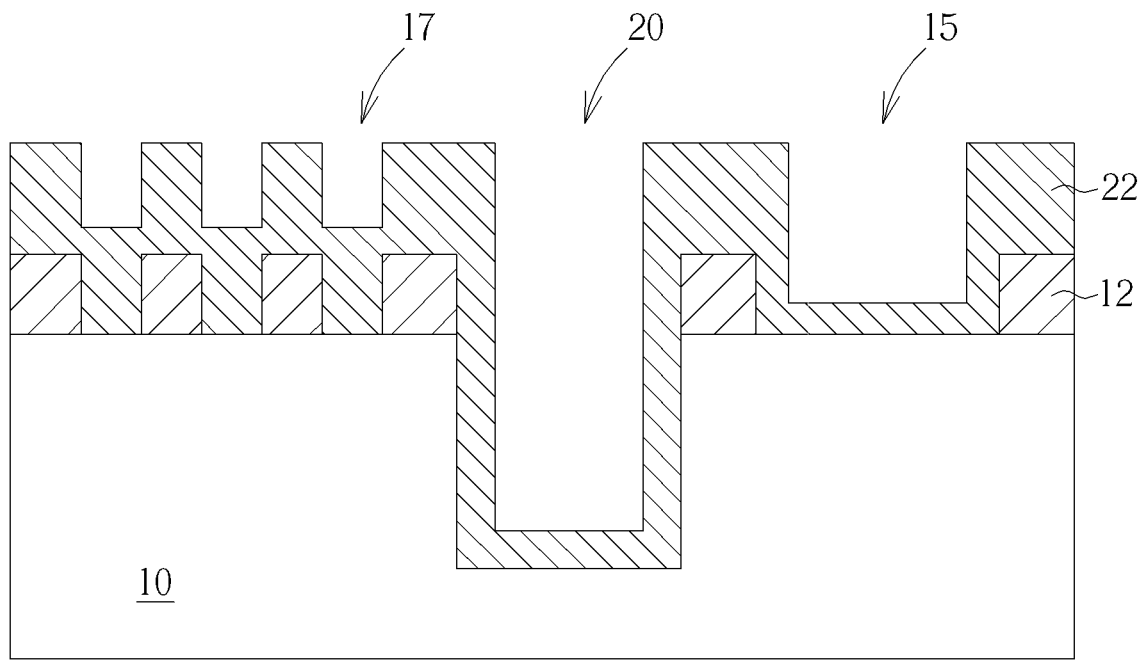

Thereafter, referring to FIGS. 1 and 6, Step 105 is performed to form a second dielectric layer such as a dielectric layer 22 on the dielectric layer 12 in compliance with a shape of the dielectric layer 12. The dielectric layer 22 has openings 15 and 17 corresponding to the openings 14 and 16 due to the conformal formation. In addition, the dielectric layer 22 covers a sidewall and a bottom of the via hole 20 and may serve as a liner of a TSV. The openings 15 and 17 may have different hole diameters. The openings 16 maybe fully filled with dielectric layer 22 due to the relatively small size, and the openings 17 are correspondingly formed above the openings 16. Nevertheless, the present invention is not limited thereto. The hole diameters of the openings 17 may be the same to each other or not all the same. When the openings 16 each have a relatively large size, the openings 16 may be not fully filled with the dielectric layer 22, so that the bottom of the opening 17 may be located within the dielectric layer 12, similar to the situation of the opening 15 having the bottom within the dielectric layer 12. The dielectric layer 22 maybe formed through a thermal oxidation process or a chemical vapor deposition process. It may be noted that the dielectric layer 22 is formed in compliance with the shape of the dielectric layer 12 or conformally, but it should not be construed that the dielectric layer 22 has a uniform thickness everywhere. The resulted thickness of the dielectric layer 22 generally depends on the surface shape of the article where it is deposited on in a real practice. For example, the thickness of the dielectric layer 22 on the sidewall of the via hole 20 is less than the thickness of the dielectric layer 22 above the dielectric layer 12. Such situations may be quickly understood by referring to conventional technologies.

Figure 7A:
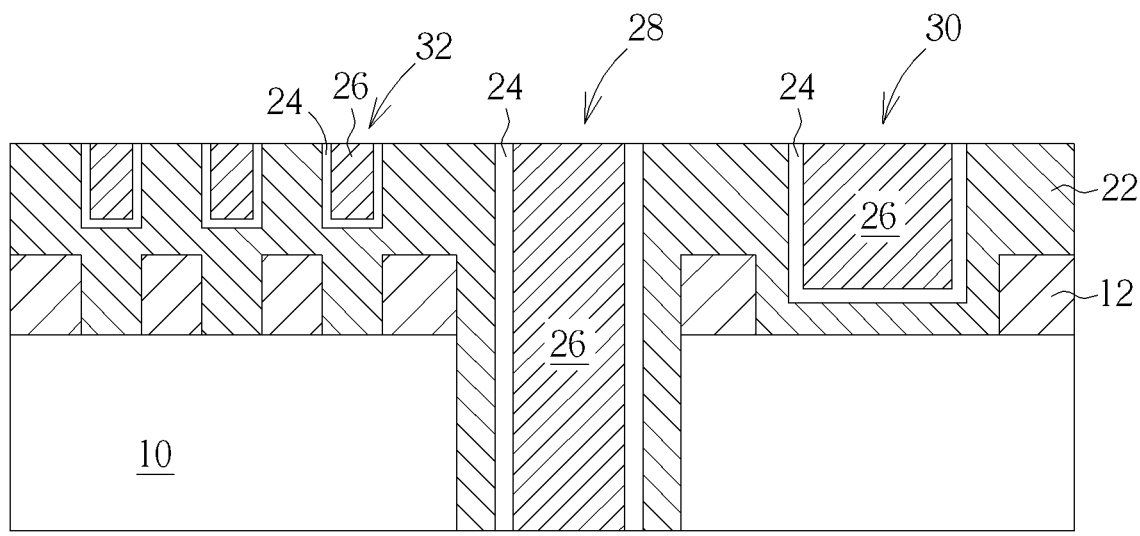
Figure 7B:
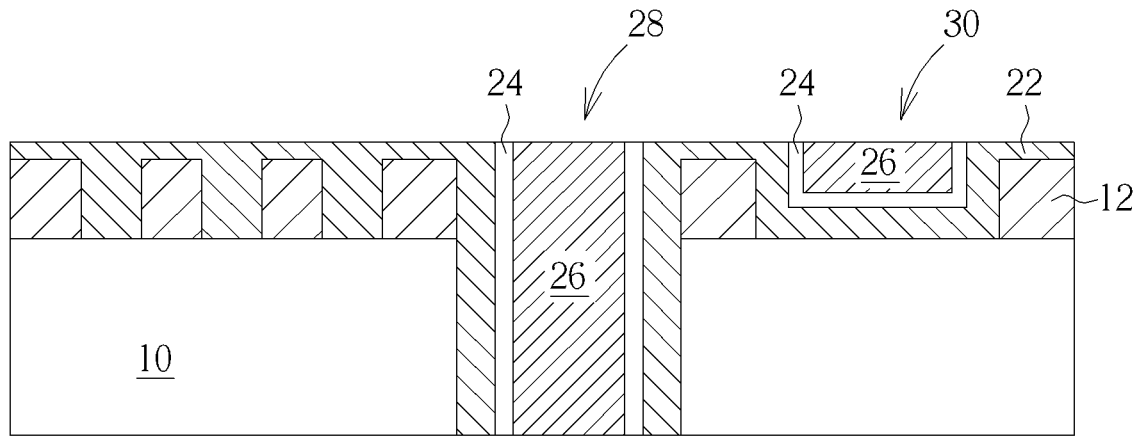
Figure 7C:
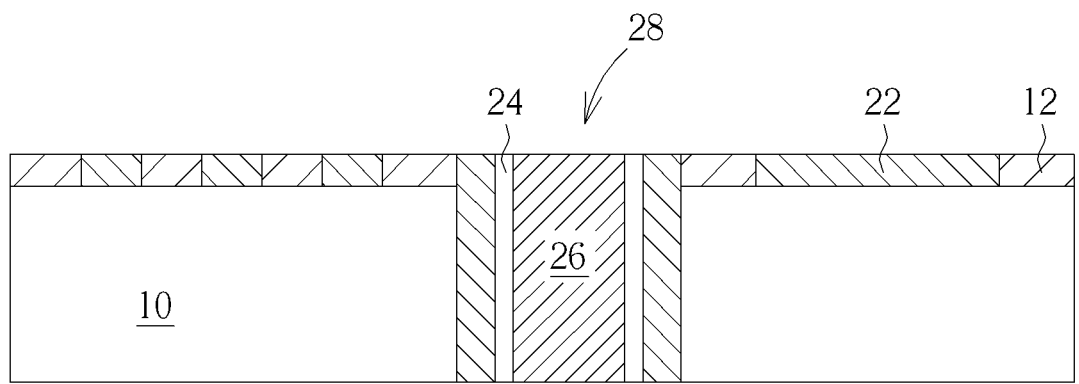
Figure 8:
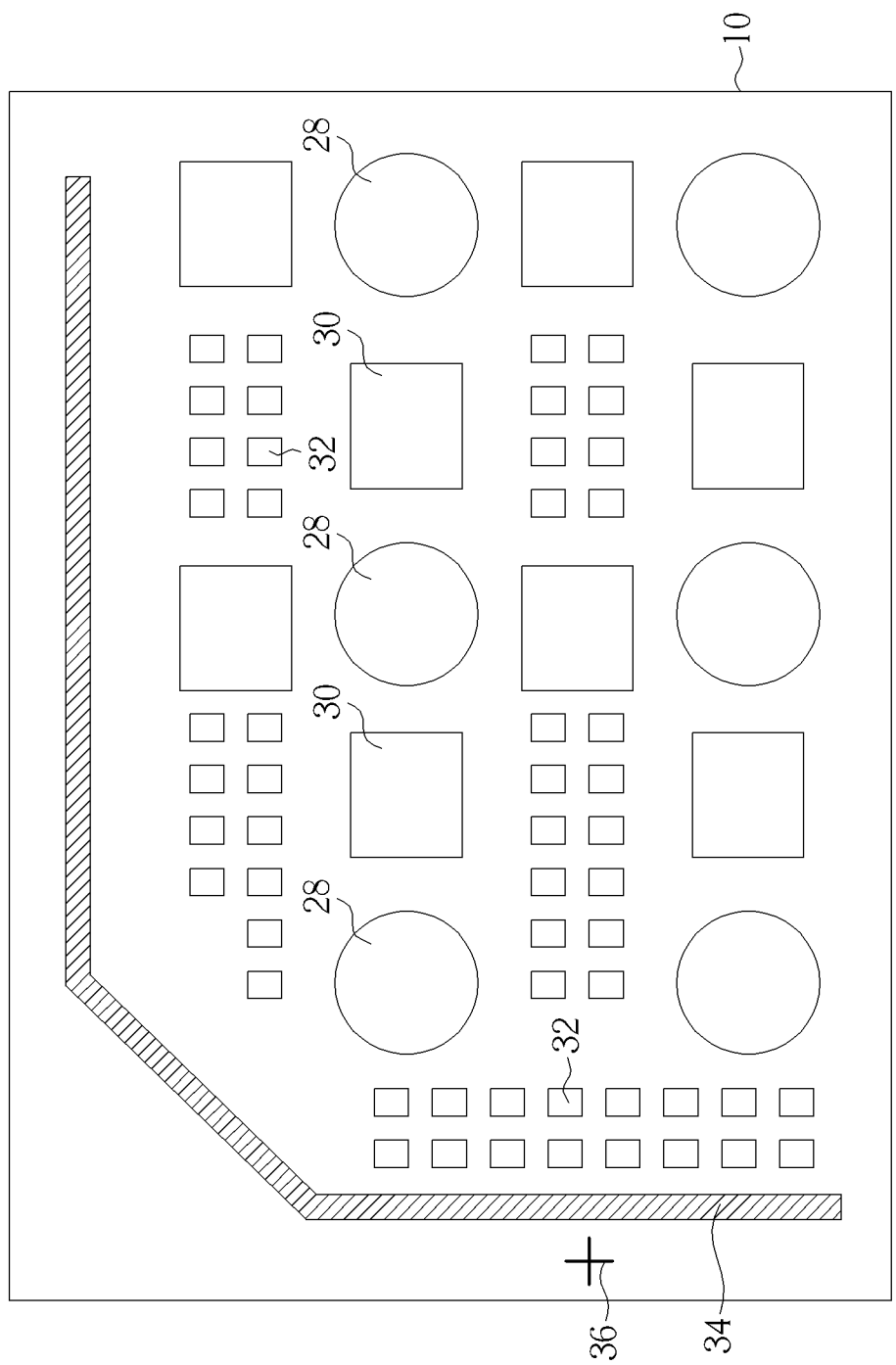
FIG. 8 is a schematic plan view illustrating one embodiment of the present invention.

Thereafter, referring to FIGS. 1 and 7A, Step 106 is performed to form a conductive material layer 26 to fill the via hole 20 and the openings 15 and 17. The conductive material layer 26 may include for example copper, tungsten, aluminum or other suitable material. The filling of the conductive material may be accomplished through for example electroplating, sputtering, CVD, electroless plating/electroless grabbing, or the like. A barrier layer 24 may be optionally formed on the surface of the dielectric layer 22 within the via hole 20 before the conductive material layer 26 is formed. That is, the barrier layer 24 may be formed between the conductive material layer 26 ad the dielectric layer 22. The barrier layer 24 may include for example Ta, TaN (tantalum nitride), Ti, TiN or a combination thereof. A seed layer (not shown) may be formed prior to the formation of the conductive material layer 26.

Thereafter, Step 107 is performed to planarize the conductive material layer 26. For example, the conductive material layer 26 of the surface of substrate 10 is polished using a CMP process for planarization, so as to form a TSV 28 within the via hole 20 and dummy TSVs 30 and 32 within the openings 15 and 17, respectively, as shown in FIG. 7A. In another embodiment, as shown in FIG. 7C, the conductive material layer 26 within the openings 15 and 17 may be completely removed during the planarization process, and accordingly the obtained TSV structure may only have a TSV 28 without a dummy TSV. In other embodiments, after the planarization, the dummy TSVs 32 may be completely removed but the residual dummy TSV 30 is not removed, as shown in FIG. 7B, because the bottom of the opening 15 is located in a relatively low place, and the bottom of the opening 17 is located in a relatively high place. In the present invention, the dummy TSVs may remain within the TSV structure or not as desired, and that is accordingly not much important. One of the important features of the present invention is that a bridge issue often existing in the conventional technology can be avoided by disposing the dummy TSVs and polishing the surface having the TSV and the dummy TSVs together during the planarization.

Thereafter, the back side of the substrate may be thinned using, for example, a CMP process to expose the conductive material layer 26.

The layout of the dummy TSV with respect to the TSV may be designed as desired, without a certain limitation. FIG. 8 is a schematic plan view illustrating one embodiment of the present invention. One or more dummy TSVs are formed near and around each TSV 28. The shape and the size of the dummy TSVs are not particularly limited. For example, the amount of the dummy TSV 30 may be one or more. The cross-sectional size, for example, a diameter, of the dummy TSV 30 may be the same or similar to that of the TSV 28, but not limited thereto, and, for example, both have a diameter of about 10 micrometers. Or, for example, the amount of the relatively small dummy TSV 32 may be one or more. The cross-sectional size, for example, a diameter, of the dummy TSV 32 may be small, and, for example, the dummy TSV 32 may have a diameter of about 4 or 0.4 micrometers or therebetween, but not limited thereto, and be particularly suitable to be located in a small area of thinly distributed metal regions outside the TSV 28 and the dummy TSVs 30. In addition, as shown in FIG. 8, an isolation structure 34 is formed, and an alignment mark structure 36 is formed within the interlayer dielectric-level zero on the substrate 10 beyond the isolation structure 34, for alignment in later processes.

In the present invention, in the through silicon via structure, the substrate may further comprise a semiconductor element, such as the situation of a through silicon via structure of a chip. In other words, the present invention may be applied to electrical connection between layers of a chip stack. In other aspect, the through silicon via structure also can be a through silicon via structure within a silicon interposer. In other words, the present invention can be applied to a silicon interposer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a through silicon via structure, comprising:

providing a substrate;

forming a first dielectric layer on the substrate;

patterning the first dielectric layer to have a plurality of first openings, wherein a bottom of the plurality of first openings is located lower than an original surface of the substrate;

forming a via hole in the first dielectric layer and the substrate, wherein the via hole not overlapping for all of the plurality of first openings;

forming a second dielectric layer on the first dielectric layer in compliance with a shape of the first dielectric layer while filling the plurality of first openings, the second dielectric layer having a plurality of second openings corresponding to the plurality of first openings, the second dielectric layer covering a sidewall of the via hole;

forming a conductive material layer to fill the via hole and the plurality of second openings; and planarizing the conductive material layer to form a through silicon via within the via hole.

2. The method according to claim 1, wherein, forming the via hole in the first dielectric layer and the substrate comprises:

forming a photo resist layer on the first dielectric layer;

patterning the photo resist layer to have a third opening; and partially removing the first dielectric layer and the substrate through the third opening to form the via hole.

3. The method according to claim 1, wherein, forming a barrier layer between the conductive material layer and the second dielectric layer.

4. The method according to claim 1, wherein, the second dielectric layer is formed through a thermal oxidation process or a chemical vapor deposition process.

5. The method according to claim 1, wherein, the second dielectric layer comprises a plurality of second openings having hole diameters not all the same.

6. The method according to claim 5, wherein, in the step of planarizing the conductive material layer, the conductive material layer within at least one of the second openings is completely removed.

7. The method according to claim 5, wherein, after planarizing the conductive material layer, a portion of the second openings and the conductive material layer within the portion of the second openings remain.

8. The method according to claim 1, wherein, the first dielectric layer has the plurality of first openings having a plurality of hole diameters, and one of the hole diameters of the first openings and a hole diameter of the via hole are the same.

9. The method according to claim 1, wherein, the substrate comprises a semiconductor element.

10. The method according to claim 1, wherein, the through silicon via structure is a through silicon via structure within a silicon interposer.

* * * * *